(12) United States Patent
Lahnor

(10) Patent No.: US 6,787,431 B2
(45) Date of Patent: Sep. 7, 2004

(54) METHOD AND SEMICONDUCTOR WAFER CONFIGURATION FOR PRODUCING AN ALIGNMENT MARK FOR SEMICONDUCTOR WAFERS

(75) Inventor: Peter Lahnor, Dresden (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/301,393

(22) Filed: Nov. 21, 2002

(65) Prior Publication Data

US 2003/0096488 A1 May 22, 2003

(30) Foreign Application Priority Data

Nov. 21, 2001 (DE) .......................................... 101 57 058

(51) Int. Cl.[7] .............................................. H01L 21/76
(52) U.S. Cl. ........................ 438/401; 438/702; 438/975; 257/797; 257/E23.179
(58) Field of Search ................................ 438/401, 702, 438/975, FOR 435; 257/797, E23.179

(56) References Cited

U.S. PATENT DOCUMENTS 6,534,159 B1 * 3/2003 Newman et al. ............ 428/209
6,537,713 B2 * 3/2003 Yeo .............................. 430/22
6,555,925 B1 * 4/2003 Higashi et al. ............. 257/797
6,577,020 B2 * 6/2003 Huang et al. ............... 257/797

FOREIGN PATENT DOCUMENTS

DE    100 46 925 A1    8/2001

* cited by examiner

Primary Examiner—George Fourson
Assistant Examiner—Thanh V Pham
(74) Attorney, Agent, or Firm—Laurence A. Greenberg; Werner H. Stemer; Gregory L. Mayback

(57) ABSTRACT

A method and a semiconductor wafer configuration for producing an alignment mark for semiconductor wafers. In the method, an alignment mark region surrounded by a metal frame is formed on the semiconductor wafer. Subsequently, the alignment mark region and the metal frame are completely buried in at least one dielectric layer, in order to define an alignment mark area in the alignment mark region on the dielectric layer with a photolithography process. The boundary of the alignment mark area lies at a uniform distance within the boundary of the alignment mark region, defined by the metal frame. Subsequently (to uncover the alignment mark area by an anisotropic etching of the dielectric layer), the etching depth is defined in such a way that the alignment mark opening extends at least as far as the level of the metal frame.

8 Claims, 3 Drawing Sheets

METHOD AND SEMICONDUCTOR WAFER CONFIGURATION FOR PRODUCING AN ALIGNMENT MARK FOR SEMICONDUCTOR WAFERS

BACKGROUND OF THE INVENTION

Field of the Invention

The invention relates to a method and a semiconductor wafer configuration for producing an alignment mark for semiconductor wafers.

Integrated circuits (on semiconductor wafers) have a center position error of two structures lying one above the other (e.g., an interconnect above a contact hole) which is only permitted to amount to about a third of the minimum structure in order to be able to utilize the maximum possible packing density of the structures. The formation of structures on semiconductor wafers is usually effected with the aid of lithographic methods. Firstly, the structures are produced by a photomask in a thin radiation-sensitive film (usually an organic photoresist layer) on the semiconductor wafer. Then, they are transferred to the underlying semiconductor layer by special etching methods.

Accordingly, it is necessary to perform an accurate alignment of the exposure device for imaging the photomask on the resist layer (for accurately superimposing a new mask structure with a structure already present on the wafer). The alignment is generally performed using alignment marks, which are provided on the semiconductor wafer (and which can be used to ascertain position errors with regard to the location of corresponding marks on the photomask according to size and direction), in order to correct the position error through a relative movement between the mask and the wafer.

Depressions on the semiconductor wafer are generally used as alignment marks. The depressions are preferably formed in the intermediate region, between the individual integrated circuits on the semiconductor wafer. The depressions are usually detected by light-optical alignment mark identification methods (e.g., "edge contrast" method).

The alignment marks are preferably formed in the context of the formation of a structure plane for fabricating integrated circuits on the semiconductor wafer. The alignment marks are defined on a photoresist layer (using lithography technology), and then are transferred to the underlying semiconductor wafer with etching. It is generally necessary (for uncovering the etching mark) to etch through a layer sequence of different dielectric layers that are stacked one above the other. Further, it is particularly true when the alignment marks serve for the alignment of masks used (in the downstream part of the fabrication process of the electrical circuits) for making contact with and connecting the individual components of the integrated circuit.

However, the uncovering of a layer stack for the formation of the alignment marks gives rise to the problem that the layers separate from one another during subsequent fabrication processes (e.g., a chemical mechanical polishing or an etching operation). Accordingly, the form of the alignment marks and the alignment mark detection signal are altered undesirably. Furthermore, there exists the risk that constituent parts of the uncovered sidewall of the alignment marks may become detached during subsequent process steps (thereby, impairing the final filling of the alignment marks). Likewise, the filled layer can become detached from the sidewalls, and the alignment mark form can thus be altered undesirably.

FIG. 1A illustrates the problem of the detachment of the layer sequence in an alignment mark depression. The alignment mark depression 6 has been produced in the context of the fabrication of contact openings for connecting different metal planes. A layer sequence of three dielectric layers 1, 2, 3 (disposed above one another) has been etched through, and the alignment mark depression 6 is filled with a contact metal 5 (after the etching operation) together with the other contact holes.

Subsequently, a chemical mechanical polishing operation (CMP) is carried out for removing the contact metal 5 again from the surface of the dielectric layer sequence. However (during the polishing operation), there exists the risk (as shown at the location identified by reference symbol 4) that the topmost dielectric layer 3 may become detached from the intermediate dielectric layer 2. As shown in FIG. 1B, there exists another risk (during the cleaning step that is subsequently carried out) of the occurrence of an undesirable incipient etching of the intermediate dielectric 2 (at the location identified by reference symbol 7). It can result in an undesirable depression in the alignment mark sidewall. Consequently, the adhesion of the contact metal filling 5 to the sidewall is reduced to such an extent that parts of the metal filling in the alignment marks become detached during the CMP step.

SUMMARY OF THE INVENTION

It is an object of the invention to provide a method and a semiconductor wafer configuration for producing an alignment mark for semiconductor wafers, that overcome the hereinafore-mentioned disadvantages of the heretofore-known devices and methods of this general type. The present invention is distinguished by an improved alignment mark.

With the foregoing and other objects in view, there is provided, in accordance with the invention, a method for fabricating an alignment mark on a semiconductor wafer. In the method, an alignment mark region surrounded by a metal frame is formed on the semiconductor wafer, and at least one dielectric layer is deposited for completely burying the metal frame with the alignment mark region.

Next, the alignment mark area is defined in the alignment mark region with a photolithography process in such a way that the boundary of the alignment mark area lies at a uniform distance within the boundary of the alignment mark region, defined by the metal frames. Then, the dielectric layer is uncovered in the alignment mark region by anisotropic etching in such a way that the alignment mark opening extends at least as far as the level of the metal frame.

Providing a uniform metal frame around the alignment mark depression helps avoid any detachment of the dielectric material at the sidewall of the alignment mark. The alignment mark formed, according to the invention, with a peripheral metal frame also retains its form in subsequent process steps. This ensures that the alignment mark contrast remains the same, thereby further ensuring reliable alignment mark identification.

In accordance with another feature of the invention, the peripheral metal frame is preferably fabricated in the context of damascene technology. A dielectric layer is deposited on the semiconductor wafer, and the metal frame structure is defined with a lithography process. Afterward, the metal frame structure is uncovered by anisotropically etching the dielectric layer and filling it with a metal layer. The metal layer is then removed as far as the surface of the dielectric layer, thereby producing a metal frame. In accordance with this embodiment, the alignment mark can be fabricated without an increased outlay, in the context of the standard damascene technique (that is customarily used to produce contacts between metal planes).

In accordance with a further feature of the invention, the formation of the metal frame in the alignment mark region is performed by applying a metal layer, defining the alignment mark region and anisotropically etching the metal layer for uncovering the alignment mark region. This simple technique makes it possible to produce the alignment mark frame for an improved protection of the alignment mark sidewall, in the context of the conventional formation of an interconnect plane.

In accordance with an added feature of the invention, the metal frame has several interleaved frame structures. This helps in optimally coordinating the metal frame structure with the uncovered layer sequence of the alignment mark depression. The reliable prevention of detachment processes between the different layers (or of undercutting in the alignment mark wall) is thereby achieved.

In accordance with an additional feature of the invention, the alignment mark region and the alignment mark area are rectangular.

With the objects of the invention in view, there is also provided a semiconductor wafer configuration for producing an alignment mark. The semiconductor wafer configuration includes a semiconductor wafer, a dielectric layer formed with a depression having a sidewall, and disposed on the semiconductor wafer. The configuration further includes a metal frame disposed on the semiconductor wafer. The metal frame completely encloses the depression and is at a uniform distance from the sidewall of the depression. The depression extends at least as far as the level of the metal frame.

Other features which are considered as characteristic for the invention are set forth in the appended claims.

Although the invention is illustrated and described herein as embodied in a method and a semiconductor wafer configuration for producing an alignment mark for semiconductor wafers, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
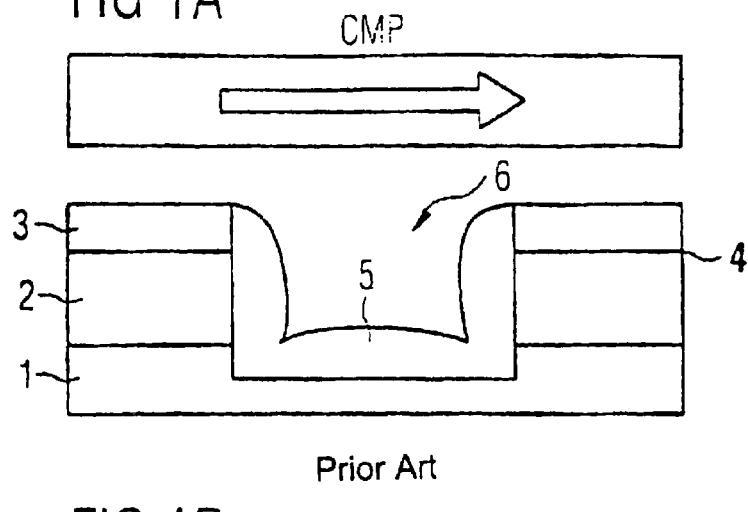
FIGS. 1A–1B are diagrammatic cross-sectional views through alignment mark openings, which are fabricated in the context of metal contact openings, with FIG. 1A illustrating a possible damage to alignment marks through a CMP process, and FIG. 1B illustrating the same through a cleaning step.
Figure 1B:
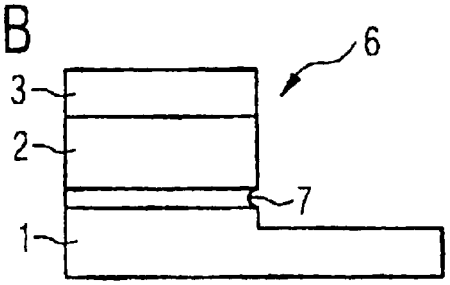
Figure 2A:
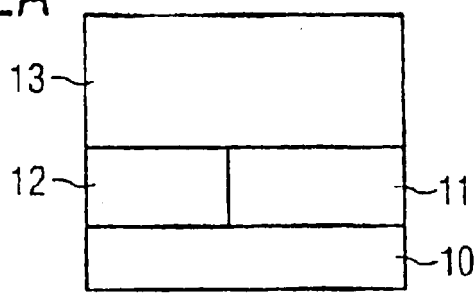
FIGS. 2A–2B are cross-sectional views through a dielectric layer sequence on a semiconductor wafer (with different process steps) for forming an alignment mark according to the invention.
Figure 2B:
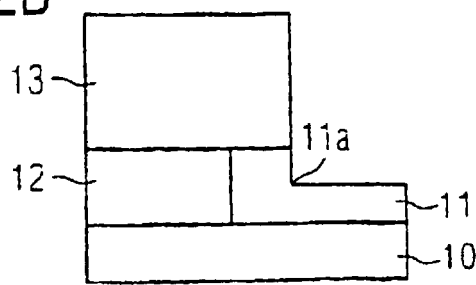

Referring now to the figures of the drawings in detail and first, particularly to FIGS. 2A–2B thereof, there is shown a process for fabricating an alignment mark on a semiconductor wafer, preferably in a scribe line region (between the integrated circuits on the semiconductor wafer). In the embodiment, the alignment mark preferably forms component connections in the context of "back end of line" (BEOL) processes (the downstream processes for fabricating integrated circuits). However, the invention can also be used to form alignment marks for a "front end of line" (FEOL) process (the first part of the overall process).

The method for fabricating alignment marks is preferably carried out in the context of the metalization of a semiconductor wafer. Firstly, there is a possibility of fabricating the alignment mark in the context of the formation of a metal plane (or in the context of the formation of contact openings between two metal planes). Since the copper metalization method preferably used (in the case of integrated circuits) is fabricated with the damascene technique, it is preferably also used for alignment mark fabrication.

Figure 6A:
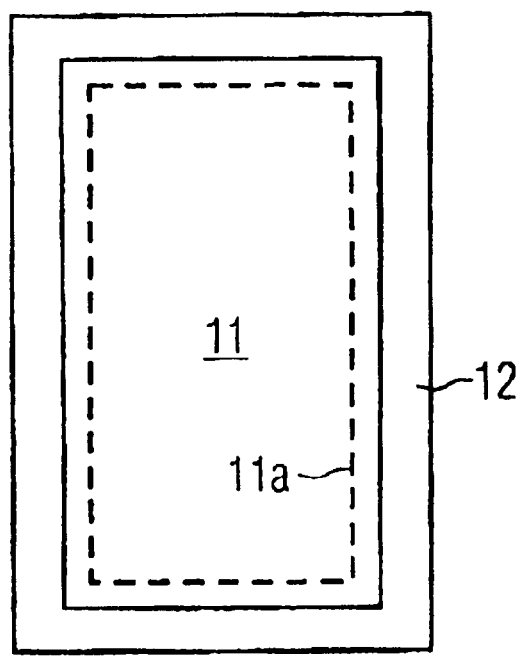
FIGS. 6A and 6B are plan views of the alignment mark region on the semiconductor wafer, with FIG. 6A corresponding to an embodiment with an individual metal frame, and FIG. 6B corresponding to a further embodiment with a nested metal frame.

A metal frame structure 12 (in a dielectric layer 11 formed on a semiconductor wafer 10), as is shown in FIG. 6A, is fabricated preferably with a conventional photolithography technique. This is done (in the context of defining contact openings in the dielectric layer 11) as follows: with a corresponding modification of a photomask, the metal frame structure 12 is produced in a photoresist layer produced on the dielectric layer. Then, it is transferred to the dielectric layer by etching. Next, the metal (e.g., copper) is deposited over the whole area of the semiconductor wafer. This metal layer is then removed again, as far as the surface of the dielectric layer 11, preferably with chemical-mechanical polishing, in order to leave only the frame structure 12 with the metal filling. A further dielectric layer 13 is subsequently applied over the whole area. A cross sectional view through the semiconductor wafer (after this process step) is shown in FIG. 2A.

In a subsequent process step, the alignment mark opening is formed once again with the photolithography technique. For this purpose, the alignment mark area is marked on a previously deposited resist layer (with the aid of a further correspondingly modified photomask). Then, it is transferred (with an anisotropic etching operation) in the dielectric stack containing the dielectric layer 11 and the dielectric layer 12. The etching depth is defined in such a way that at least the level of the metal frame 12 is reached. The alignment mark area is defined in such a way that the area lies completely within the metal frame 12, and is at a uniform distance from the latter.

FIG. 2B shows a cross section through the semiconductor wafer after the production of the alignment mark. The boundary of the alignment mark is designated by the reference symbol 11a. The alignment mark edge 11a is also illustrated by broken lines within the metal frame 12 (in the plan view) in FIG. 6A. In the embodiment illustrated, the metal frame 12 and the alignment mark area are made rectangular in each case, so that the structures can be produced simply.

Instead of the illustrated formation of the metal frame (with the damascene method), it is also possible to fabricate the metal enclosure of the alignment mark area in the context of the formation of a metal plane. For this purpose, the metal layer is deposited over the whole area of the semiconductor wafer. Then, it is patterned, in the context of the formation of interconnects (with the photolithography technique), in such a way that a metal frame 12 (as shown in FIG. 6A) is formed. Next, the dielectric layer stack, including the dielectric layer 11 and the dielectric layer 13, is deposited again. Then, the dielectric layer stack is processed for forming the alignment mark opening (in accordance with the process explained with reference to FIGS. 5A–5B).

The formation of a metal frame around the depression of the alignment mark ensures that the alignment mark form is also not damaged by process steps (which follow the alignment mark formation and mechanically or chemically attack the uncovered layer sequence). Accordingly, any alteration of the alignment mark identification signal is avoided. In particular, the metal frame ensures that the different layers (of the uncovered layer sequence in the alignment mark) do not become detached from one another. Furthermore, the metal frame ensures that subsequent cleaning operations, which are usually associated with chemical etching steps, do not lead to the undercutting of the uncovered intermediate dielectric layers in the alignment mark depression.

Figure 6B:
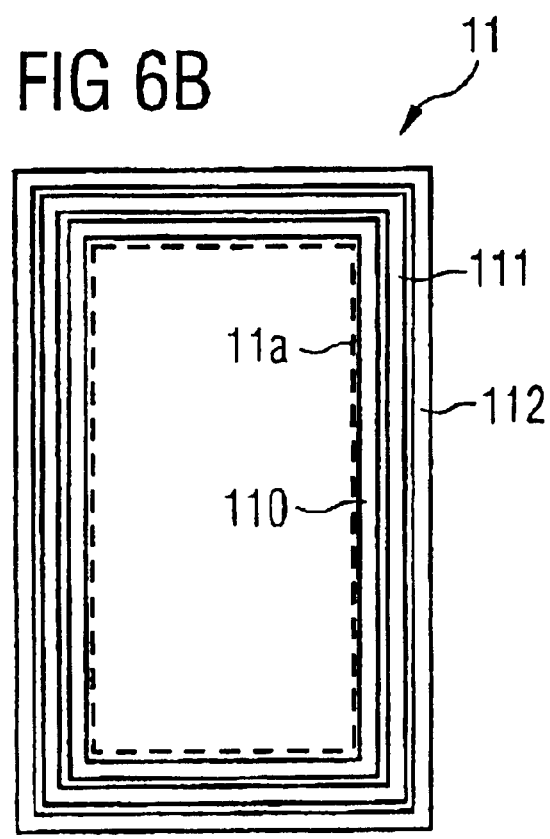

FIG. 6B shows a further embodiment, in which an interleaved metal frame structure is used (instead of an individual metal frame). In this embodiment, the metal frame 11 contains three interleaved frame structures 110, 111 and 112. The provision of a nested frame structure makes it possible to optimally coordinate the metal frame with the form of the alignment mark depression or with the dielectric layers used.

It is possible also to provide the metal frames, at varying depth, to prevent the detachment of specific dielectric layers in the uncovered layer stack of the alignment mark depression.

Figure 3A:
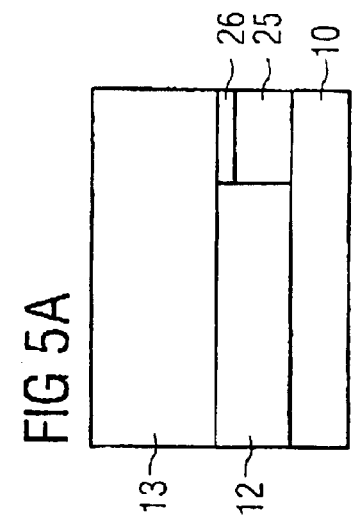
FIGS. 3A–3C, 4A–4B and 5A–5B are cross-sectional views through different alignment mark layer sequences with a metal frame.

FIGS. 3A to 5B show further layer sequences of an alignment mark depression with a metal frame 12 according to the invention. Referring to FIGS. 3A–3B, the metal frame 12 is encapsulated by an intermediate dielectric layer 21. The starting situation for the fabrication of the alignment mark depression 6 is shown in FIG. 3A. The metal frame 12 is formed (on the semiconductor wafer) in the alignment mark region, and is enclosed by the intermediate dielectric layer 21. A further filling dielectric 22 is provided (in the intermediate dielectric layer) at a distance from the metal frame 12. The filling dielectric 22 is removed again from the dielectric 21 (in the regions elevated by the metal layer 12) by a CMP or a planarizing etching-back technique. The construction is subsequently covered by the upper dielectric layer 13.

Figure 3B:
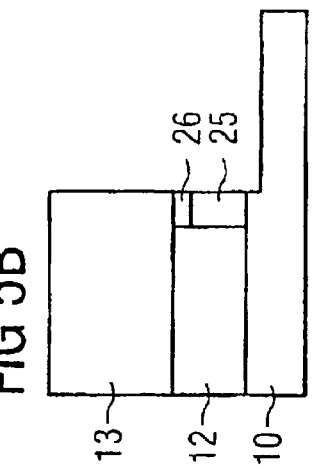
Figure 3C:
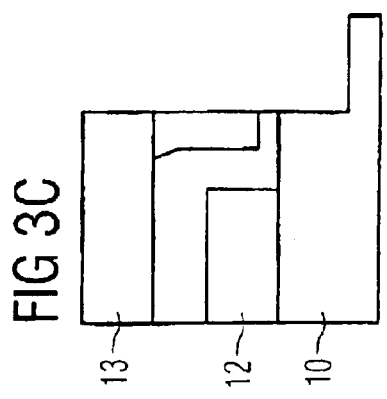

The alignment mark opening can be formed in such a way that the complete layer sequence is etched through. Accordingly, the entire filling dielectric 22 may be removed (as shown in FIG. 3B), or a covering layer section 22 remains at the sidewall of the alignment mark opening (as shown in FIG. 3C).

Figure 4A:
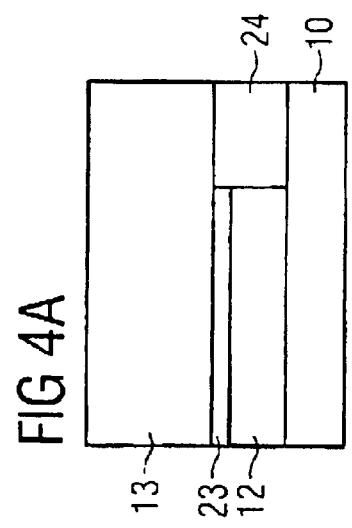
Figure 4B:
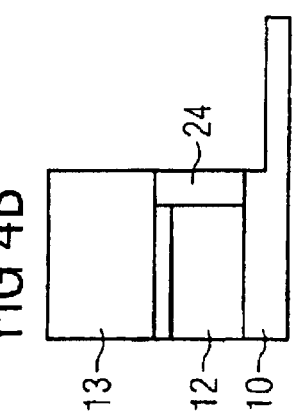

FIGS. 4A–4B show a further embodiment of an alignment mark depression. In this embodiment, the metal frame 12 is covered by a hard mask 23, and the intermediate dielectric filling 24 is provided in front of the metal frame 12 and the hard mask covering layer 13 (which are again planarized by a CMP or by an etching-back technique with a stop on the hard mask). The entire layer sequence is again covered with the upper dielectric layer 13. As shown in FIG. 4B, the alignment mark is formed in such a way that, the entire layer sequence is "etched through" as far as the semiconductor wafer 10, and a covering layer of the intermediate dielectric layer 24 remains in front of the metal frame 12 and the hard mask layer 13.

Figure 5A:
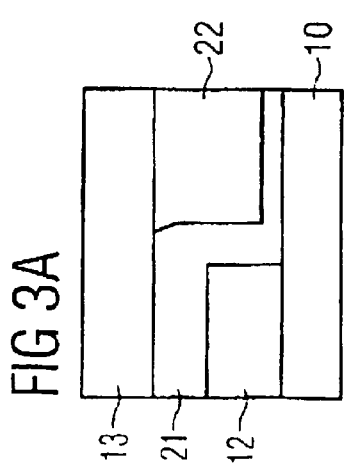
Figure 5B:
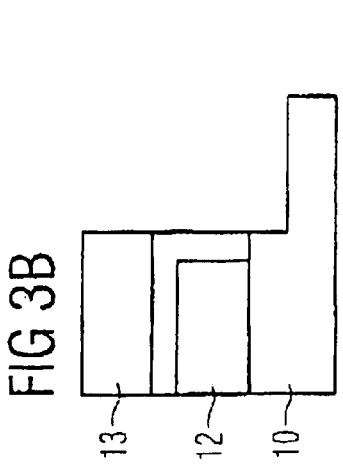

FIGS. 5A–5B show an alignment mark depression in the context of a dual damascene process sequence, in which the starting state (as shown in FIG. 5A) includes a layer sequence on the semiconductor wafer. A double dielectric intermediate layer 25, 26 is provided in front of the metal frame 12, and is again covered (together with the metal frame) by the upper dielectric layer 13. Then, the alignment mark is uncovered (as shown in FIG. 5B) in such a way that a covering layer made of the double dielectric layer 25, 26 remains in front of the metal frame 12.

I claim:

1. A method for fabricating an alignment mark on a semiconductor wafer, which comprises the steps of:

forming an alignment mark region surrounded by a metal frame on the semiconductor wafer;

depositing at least one dielectric layer for completely burying the metal frame with the alignment mark region;

defining an alignment mark area in the alignment mark region on the dielectric layer with photolithography;

positioning a boundary of the alignment mark area at a uniform distance within a boundary of the alignment mark region defined by the metal frame; and uncovering the alignment mark area and extending an alignment mark opening at least to the level of the metal frame by anisotropically etching the dielectric layer with a defined etching depth.

2. The method according to claim 1, wherein the forming step comprises:

depositing the dielectric layer on the semiconductor wafer;

defining a metal frame structure on the dielectric layer with photolithography;

uncovering the metal frame structure by anisotropiclly etching the dielectric layer;

depositing the metal layer; and removing the metal layer as far as the surface of the dielectric layer.

3. The method according to claim 1, wherein the forming step further comprises:

applying the metal layer on the semiconductor wafer;

defining the alignment mark region on the metal layer with photolithography; and uncovering the alignment mark region by anisotropically etching the metal layer.

4. The method according to claim 1, wherein the metal frame includes a plurality of interleaved frame structures.

5. The method according to claim 1, wherein the alignment mark region and the alignment mark area are rectangular.

6. A semiconductor wafer configuration, comprising:

a semiconductor wafer;

a dielectric layer formed with an alignment mark depression having a sidewall, and disposed on said semiconductor wafer; and a metal frame disposed on said semiconductor wafer, and being completely buried by said dielectric layer, said metal frame completely enclosing said depression and being at a uniform distance from said sidewall of said depression;

said depression extending in said dielectric layer at least as far as a level of said metal frame.

7. The semiconductor wafer configuration according to claim 6, wherein said metal frame includes a plurality of interleaved frame structures.

8. An alignment mark configuration, provided on a semiconductor wafer, comprising:

a plurality of dielectric layers formed with an alignment mark depression having a sidewall, and disposed on the semiconductor wafer; and a metal frame disposed on said semiconductor wafer and being completely buried by said dielectric layer, said metal frame completely enclosing said depression and being at a uniform distance from said sidewall of said depression;

said depression extending in said plurality of dielectric layers at least as far as a level of said metal frame.

* * * * *